(12) United States Patent
Wu et al.

(10) Patent No.: US 7,696,465 B2
(45) Date of Patent: Apr. 13, 2010

(54) IMAGE SENSOR PACKAGE, CAMERA MODULE HAVING SAME AND MANUFACTURING METHOD FOR THE SAME

(75) Inventors: Ying-Cheng Wu, Taipei Hsien (TW); Chi-Kuei Lee, Taipei Hsien (TW); Shih-Min Wang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/192,084

(22) Filed: Aug. 14, 2008

(65) Prior Publication Data
US 2009/0283662 A1 Nov. 19, 2009

(30) Foreign Application Priority Data
May 13, 2008 (CN) .................. 2008 1 0301554

(51) Int. Cl.
*H01L 27/00* (2006.01)
(52) U.S. Cl. .................................. 250/208.1; 250/239

(58) Field of Classification Search ............. 250/208.1, 250/239
See application file for complete search history.

(56) References Cited

U.S. PATENT DOCUMENTS

| 7,572,676 | B2 * | 8/2009 | Leu et al. ..................... 438/116 |
|---|---|---|---|
| 2006/0027740 | A1 * | 2/2006 | Glenn et al. ................ 250/239 |
| 2006/0030070 | A1 * | 2/2006 | Leu et al. .................... 438/106 |
| 2007/0145569 | A1 * | 6/2007 | Hsin .......................... 257/700 |
| 2007/0195188 | A1 * | 8/2007 | Leu et al. .................... 348/340 |
| 2007/0236596 | A1 * | 10/2007 | Sekine et al. ............... 348/340 |
| 2007/0241273 | A1 * | 10/2007 | Kim et al. ................... 250/239 |

* cited by examiner

*Primary Examiner*—Seung C Sohn
(74) *Attorney, Agent, or Firm*—Zhigang Ma

(57) ABSTRACT

An exemplary image sensor package includes a substrate, an imaging area, a circuit layer and two passive components. The substrate has a first surface and a second surface, which are opposite to each other. An image sensing area is formed on the first surface of the substrate and a circuit layer is formed on the second surface of the substrate. The passive components opposite to the image sensing area are soldered to the circuit layer of the second surface.

16 Claims, 6 Drawing Sheets ic, cross-sectional view showing how to manufacture the image sensor package of FIG. 4.

IMAGE SENSOR PACKAGE, CAMERA MODULE HAVING SAME AND MANUFACTURING METHOD FOR THE SAME

BACKGROUND

1. Technical Field

The invention relates to semiconductor packages and, particularly, to an image sensor package, camera module having the same and manufacturing method for the same.

2. Description of the Related Art

A camera module typically includes an image sensor package and a number of passive components, which, when interconnected, form a complete circuit. Accordingly, a circuit board is required to support the image sensor package and the passive components, and to establish the interconnection between the image sensor package and the passive components. However, the circuit board may not be beneficial for miniaturization of the camera module.

Therefore, it is desirable to provide an image sensor package, a camera module having same, and a manufacturing method of image sensor package, which can overcome the above-mentioned problem.

SUMMARY

An exemplary image sensor package includes a substrate, an imaging area, a circuit layer and two passive components. The substrate has a first surface and a second surface, which are opposite to each other. An image sensing area is formed on the first surface of the substrate and a circuit layer is formed on the second surface of the substrate. The passive components opposite to the image sensing area are soldered to the circuit layer of the second surface.

BRIEF DESCRIPTION OF THE DRAWINGS

Many aspects of the present image sensor package, camera module and manufacturing method of the image sensor package should be better understood with reference to the accompanying drawings. The components in the drawings are not necessarily drawn to scale, the emphasis instead being placed upon clearly illustrating the principles of the present image sensor package, camera module and manufacturing method of the image sensor package. Moreover, in the drawings, like reference numerals designate corresponding parts throughout the several views.

DETAILED DESCRIPTION OF EMBODIMENTS

Embodiments of the present image sensor package, camera module and manufacturing method of the image sensor package will now be described in detail with reference to the drawings.

Figure 1:
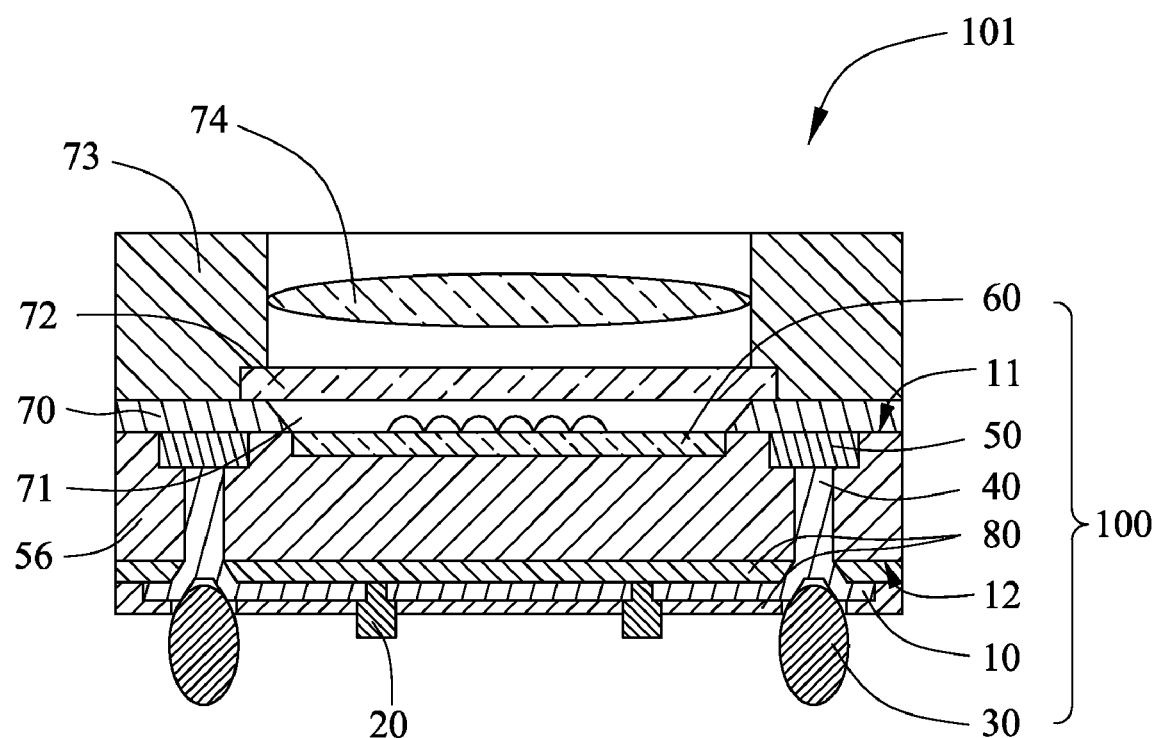
FIG. 1 is a schematic, cross-sectional view of a package of a camera module including an image sensor package, according to a first exemplary embodiment.

Referring to FIG. 1, a camera module 101, according to a first exemplary embodiment, is shown. The camera module 101 includes an image sensor package 100, two passive components 20, a spacer 70, a cover glass 72, a lens barrel 73, and a lens 74. In this embodiment, the passive components 20 have a resistor, a capacitor, or an inductor (not shown).

The image sensor package 100 includes a substrate 56, a circuit layer 10, a number of solder balls 30, a number of through silicon vias (TSVs) 40, a number of bonding pads 50, and an imaging area 60. The substrate 56 can be a silicon die and includes a first surface 11 and a second surface 12, which are opposite to each other. The imaging area 60 is formed and centered on the first surface 11. The circuit layer 10 is deposited on the second surface 12. The bonding pads 50 are formed on the first surface 11 and surround the imaging area 60. The solder balls 30 are formed at the second surface 12 of the substrate 56 opposite the imaging area 60. Each solder ball 30 is interconnected with a corresponding bonding pad 50 via a respective TSV 40. In this embodiment, the number of the solder balls 30, TSV 40 and bonding pads 50 is two. The TSVs 40 are electrically connected to the circuit layer 10 and can be made of copper.

The passive components 20 are soldered to the circuit layer 10. Thereby the imaging area 60, the TSVs 40, the circuit layer 10 and the passive components 20 form a complete circuit.

In this embodiment, the size of the image sensor package 100 is above 4*4 (mm$^2$) and that of the passive component 20 is about 0.5*0.25*0.25 (mm$^3$). Therefore, the passive components 20 can be reasonably soldered to the circuit layer 10. In this embodiment, the image sensor package 100 further includes two protective layers 80. One of the protective layers 80 is interposed between the substrate 56 and the circuit layer 10. Another protective layer 80 is disposed on a surface of the circuit layer 10 opposite the substrate 56. The protective layers 80 are configured for protecting the circuit layer 10 from being abraded. Understandably, the protective layers 80 can be omitted in other alternative embodiments.

The image sensor 100 can be electrically coupled to external circuit(s) (not shown) via the solder balls 30. In this embodiment, a height of the solder balls 30 is greater than that of the passive components 20.

The cover glass 72 is configured for encapsulating the imaging area 60. The spacer 70 is configured for spacing the cover glass 72 and the imaging area 60. In this embodiment, the spacer 70 is deposited on the first surface 11 and defines an aperture 71 therein to allow light pass therethrough to the entire the imaging area 60. The cover glass 72 is deposited on the spacer 70 and seals the aperture 71 to keep out dusts away from the image sensor area 60. Understandably, the glass layer 72 can be omitted.

The lens barrel 73 is deposited on the spacer 70 with its image side located by the cover glass 72. The lens 74 is received in the lens barrel 73 and is coaxially aligned with the imaging area 60.

In this embodiment, since the camera module 101 provides the circuit layer 10 on the second surface 12 and the passive components 20 can be soldered to the circuit layer 10, the camera module 101 can therefore be miniaturized.

Figure 2:
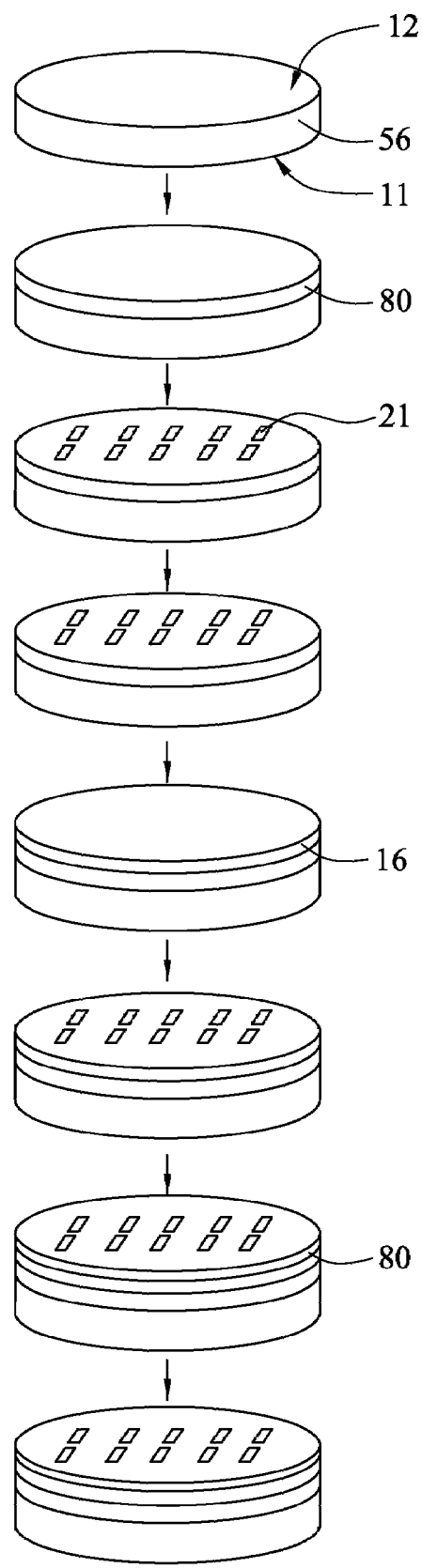
FIG. 2 is a schematic, isometric view showing how to manufacture the image sensor package of FIG. 1.
Figure 3:
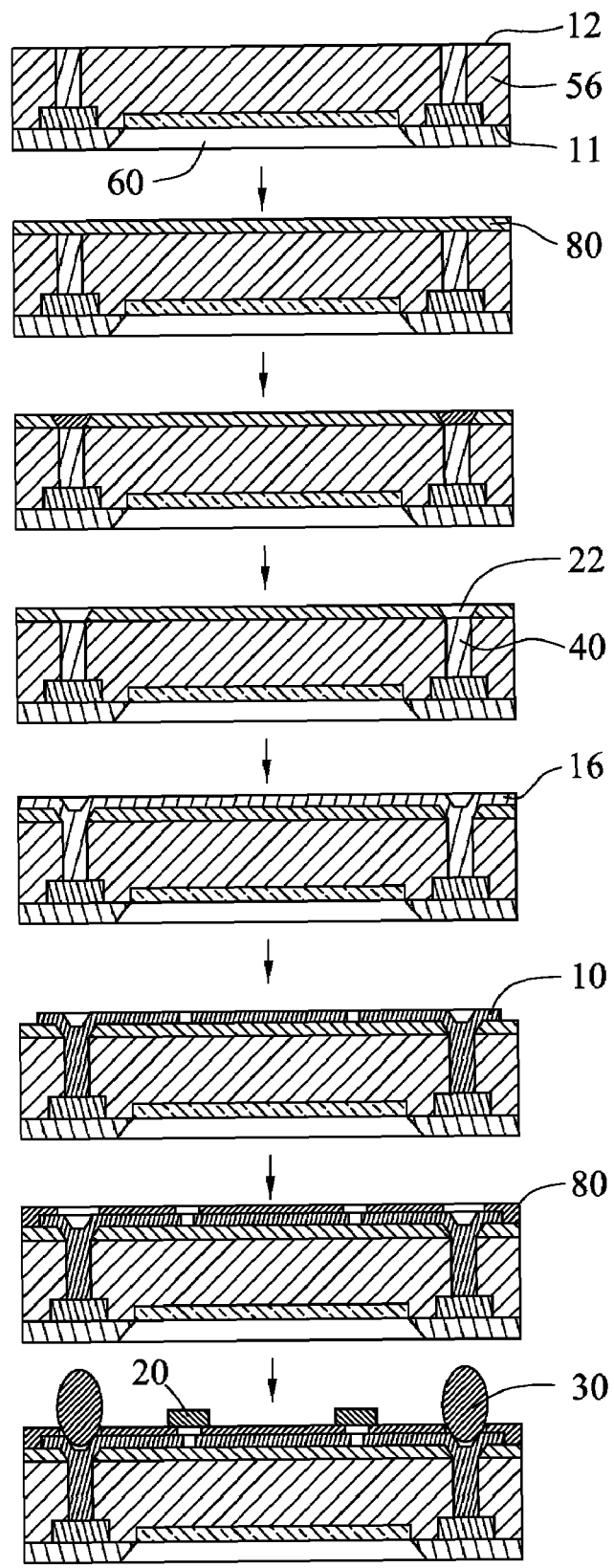
FIG. 3 is a schematic, cross-sectional view showing how to manufacture the image sensor package of FIG. 1.

As shown in FIGS. 2 and 3, a manufacturing method of the image sensor package 100 includes the steps 310 through 380:

In step 310, imaging areas 60 are formed on a first surface 11 of a substrate 56. In this embodiment, a number of the imaging areas 60 are ten.

In step 320, a protective layer 80 is coated on a second surface 12 of the substrate 56.

In step 330, the coated second surface 12 is exposed. Ten areas 21 are formed corresponding to the imaging areas 60 formed on the first surface 11 of the substrate 56.

In step 340, the exposed second surface 12 is developed and ten through silicon vias (TSVs) 40 are revealed by the ten openings 22.

In step 350, the developed second surface 12 is sputtered. In this embodiment, a metal layer 16 is formed on the protective layer 80 and the TSVs 40 by sputtering.

In step 360, the metal layer 16 is etched corresponding to positions of the imaging areas 60. In this embodiment, a circuit layer 10 is formed by etching.

In step 370, the etched second surface 12 is printed. In this embodiment, the protective layer 80 is formed on the circuit layer 10.

In step 380, solder balls 30 are soldered on the openings 22 of the TSVs 40 and passive components 20 are soldered on the center of the circuit layer 10. After soldering, the substrate 56 is divided into a number of dies (not shown) of the image sensor packages 100. In this embodiment, each of the image sensor packages 100 has the substrate 56, the circuit layer 10, the two solder balls 30 and the passive components 20.

Figure 4:
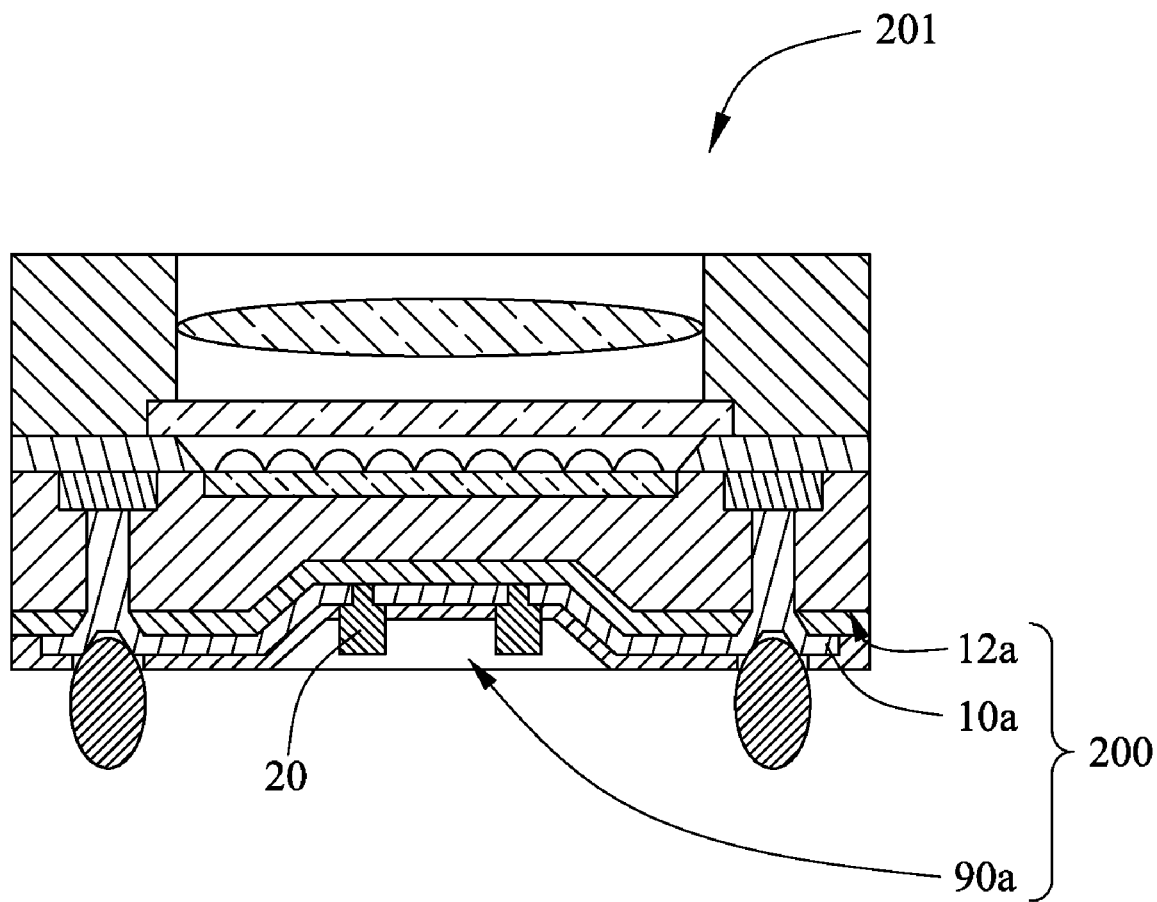
FIG. 4 is a schematic, cross-sectional view of a package of a camera module including an image sensor package, according to a second exemplary embodiment.

Referring to FIG. 4, a camera module 201 is shown according to a second embodiment. The camera module 201 is essentially similar to the camera module 101 except that the substrate of the image sensor package 200 defines a concave in the second surface 12a thereof; the circuit layer 10a is formed in the concave; and the two passive components 20 are soldered to the circuit layer and received in the concave.

Figure 5:
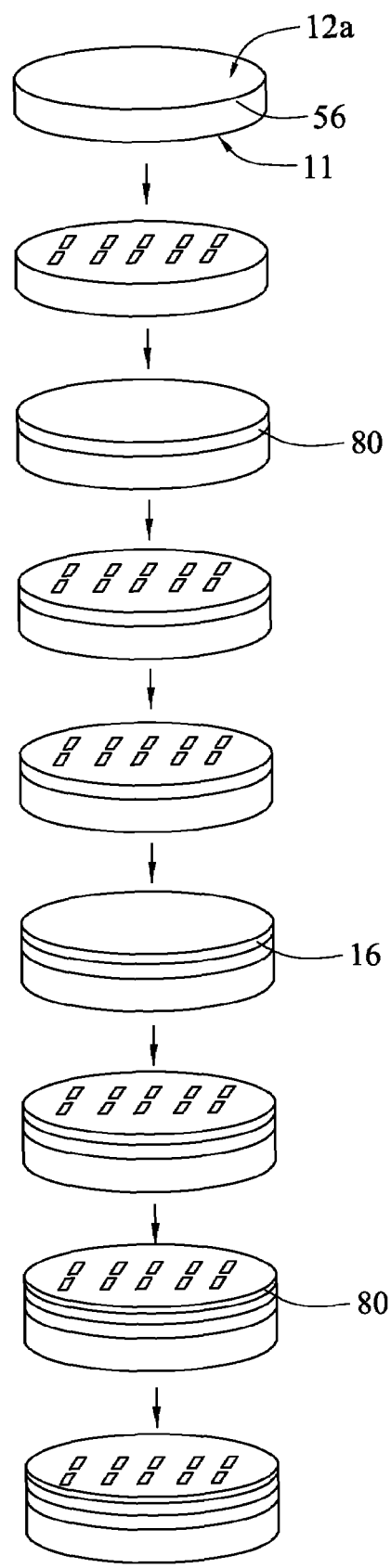
FIG. 5 is a schematic, isometric view showing how to manufacture the image sensor package of FIG. 4.
Figure 6:
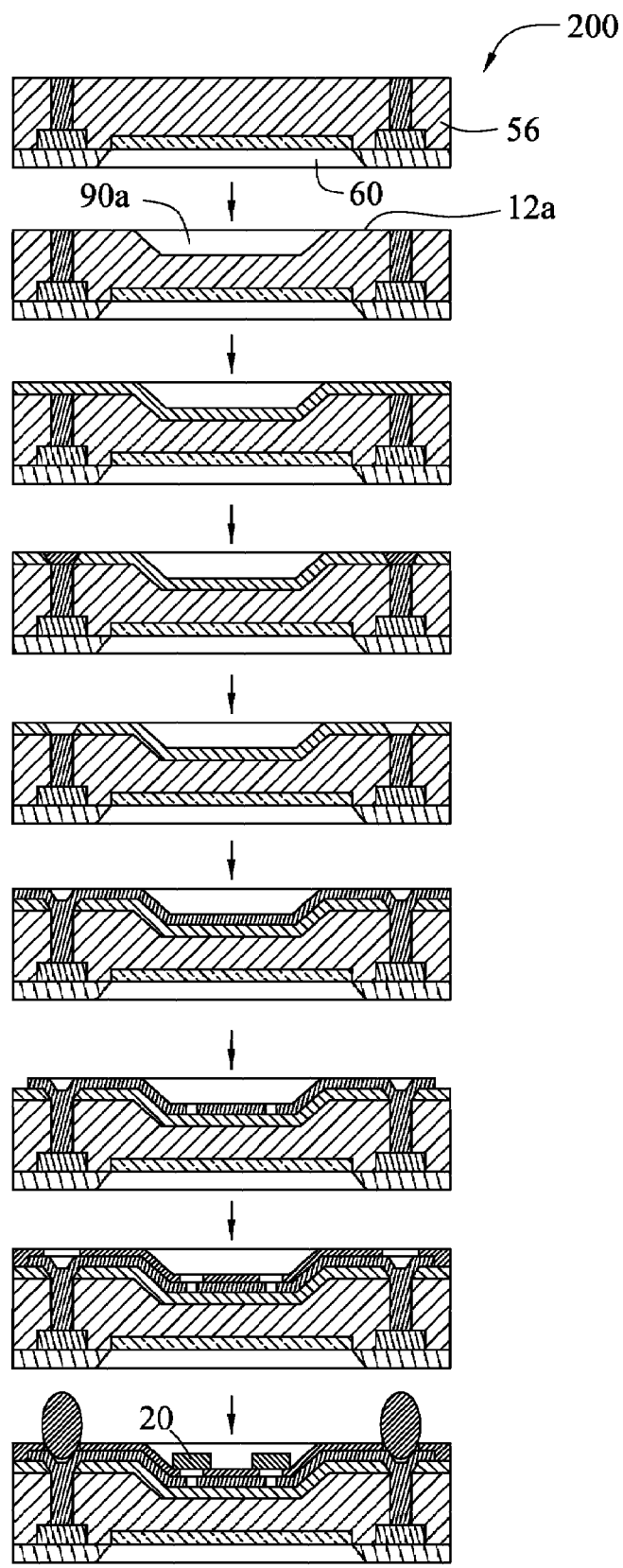
FIG. 6 is a schematic, cross-sectional view showing how to manufacture the image sensor package of FIG. 4.

As shown in FIGS. 5 and 6, a manufacturing method of the image sensor package 200 is shown. The manufacturing method of the image sensors 200 is similar to the manufacturing method of the image sensors 100. The difference is that, the second surface 12a of the substrate 56 is etched corresponding to the imaging areas 60 and forms the concave areas 90a according to the corresponding imaging area 60 before the coating step 320. In this embodiment, a number of the concave areas 90a is the same with a number of the imaging areas 60. Understandably, the passive components 20 are soldered to the circuit layer 10 for forming the camera module 201.

The image sensor packages 100, 200 and manufacturing methods of the image sensor packages 100, 200 can provide the circuit layer 10 on the second surface 12 of the image sensor packages 100, 200 and the passive components 20 deposited on the circuit layer 10 are electrically coupled to the image sensor packages 100, 200. Therefore, the image sensor packages 100, 200 can be miniaturized for occupying smaller space in the camera module 101.

It will be understood that the previously particular embodiments and methods are shown and described by way of illustration only. The principles and the features of the present invention may be employed in various and numerous embodiment thereof without departing from the scope of the invention as claimed. The previously-described embodiments illustrate the scope of the invention but do not restrict the scope of the invention.

What is claimed is:

1. An image sensor package, comprising:
   a substrate having a first surface and a second surface, opposite to each other;
   an imaging area forming on the first surface of the substrate;
   a circuit layer formed on the second surface of the substrate; and
   passive components opposite to the image sensing area soldered to the circuit layer of the second surface.

2. The image sensor package of claim 1, wherein the second surface forms a concave area on which the circuit layer is formed.

3. The image sensor package of claim 1, comprising solder balls formed on the circuit layer.

4. The image sensor package of claim 1, wherein the circuit layer has two opposite surfaces respectively coated with protective layers thereon.

5. The image sensor package of claim 1, wherein the substrate is made with silicon material.

6. The image sensor package of claim 3, wherein a height each of the solder balls is bigger than a height of each of the passive components.

7. The image sensor package of claim 1, wherein each of the passive components is one selected from the group consisting of a resistor, a capacitor and an inductor.

8. A manufacturing method of an image sensor package, comprising:
   supplying a substrate with a first surface and a second surface, opposite to each other;
   forming imaging areas at the first surface of a substrate;
   forming a circuit layer on the second surface of the substrate corresponding to the imaging areas of the surface; and
   soldering passive components on the circuit layer of the second surface opposite to the imaging area of the first surface.

9. The manufacturing method of claim 8, further comprising:
   coating a protective layer on the second surface;
   exposing the protective layer of the second surface; and
   developing the protective layer of the second surface to form openings of through vias.

10. The manufacturing method of claim 9, further comprising:
    forming a protective layer of the circuit layer; and
    soldering solder balls on the corresponding openings of the through vias, -respectively.

11. The manufacturing method of claim 8, wherein the circuit layer is formed on the second surface by sputtering.

12. The manufacturing method of claim 8, wherein the second surface is etched to form a plurality of concave areas thereon according to the corresponding positions of the imaging areas before the circuit layer is formed on the second surface.

13. The manufacturing method of claim 8, wherein the substrate is made of silicon material.

14. The manufacturing method of claim 10, wherein a height of each of the solder balls is bigger than a height of each of the passive components.

15. The manufacturing method of claim 10, wherein the through vias are made of copper.

16. The manufacturing method of claim 8, wherein each of the passive components is one selected from the group consisting of a resistor, a capacitor and an inductor.

* * * * *